(12) United States Patent
Srivastava et al.

(10) Patent No.: US 12,740,041 B2
(45) Date of Patent: Sep. 15, 2026

(54) SELECTIVE ETCHING AND DEPOSITION OF MEMORY LAYERS TO PROVIDE CAPACITOR-TO-ACTIVE SILICON ELECTRICAL COUPLING

(71) Applicant: LAM RESEARCH CORPORATION, Fremont, CA (US)

(72) Inventors: Ratndeep Srivastava, San Jose, CA (US); Hui Gao, Fremont, CA (US); Samantha Doan, Pleasanton, CA (US); Ganesh Upadhyaya, Pleasanton, CA (US); Gowri Channa Kamarthy, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 756 days.

(21) Appl. No.: 18/013,144

(22) PCT Filed: Mar. 16, 2022

(86) PCT No.: PCT/US2022/020478
§ 371 (c)(1),
(2) Date: Dec. 27, 2022

(87) PCT Pub. No.: WO2022/203909
PCT Pub. Date: Sep. 29, 2022

(65) Prior Publication Data

US 2023/0320062 A1 Oct. 5, 2023

Related U.S. Application Data

(60) Provisional application No. 63/163,989, filed on Mar. 22, 2021.

(51) Int. Cl.
*H10B 12/00* (2023.01)
*C23C 16/455* (2006.01)
(Continued)

(52) U.S. Cl.
CPC ... *H10B 12/0335* (2023.02); *C23C 16/45544* (2013.01); *H10B 12/315* (2023.02);
(Continued)

(58) Field of Classification Search
CPC .............. H10B 12/0335; H10B 12/315; H10B 12/482; H10B 12/488
See application file for complete search history.

(56) References Cited

U.S. PATENT DOCUMENTS

| | | | |
|---|---|---|---|
| 6,277,756 | B1 | 8/2001 | Ohara et al. |
| 2003/0073280 | A1 | 4/2003 | Kobayashi et al. |

(Continued)

OTHER PUBLICATIONS

Chen et al., The Influence of Methane/Argon Plasma Composition on the Formation of the Hydrogenated Amorpohous Carbon Films, 2009, Elsevier (Year: 2009).*
Office Action issued in corresponding Taiwanese Application No. 111110053 dated Oct. 22, 2025.
International Search Report and Written Opinion of the ISA issued in PCT/US2022/020478, mailed Jun. 27, 2022; ISA/KR.

*Primary Examiner* — Marlon T Fletcher
*Assistant Examiner* — Samuel Jonathan Smith

(57) ABSTRACT

A method to electrically couple a capacitor to an active silicon region of a memory structure includes: providing a substrate including the memory structure; performing deposition and etch cycles to remove a portion of one or more dielectric layers from the substrate, enlarge a trench between adjacent bitline structures, and provide access to at least one of a polymer layer or a dielectric layer adjacent to an upper portion of the active silicon region; performing a breakthrough operation including etching the polymer layer or the dielectric layer in the trench to expose the upper portion of the active silicon region; and performing an over-etch operation to remove the upper portion of the active silicon region to provide access for electrically coupling the capacitor to a remaining lower portion of the active silicon region. The over-etch operation is distinct from the breakthrough operation.

31 Claims, 10 Drawing Sheets

(51) Int. Cl.

| | |
|---|---|
| ***H10P 14/60*** | (2026.01) |
| ***H10P 14/694*** | (2026.01) |
| ***H10P 50/26*** | (2026.01) |
| ***H10P 50/28*** | (2026.01) |
| ***H10P 70/00*** | (2026.01) |
| ***H10P 72/00*** | (2026.01) |
| ***H10W 20/43*** | (2026.01) |
| ***H10W 20/47*** | (2026.01) |

(52) U.S. Cl.

CPC ......... *H10B 12/482* (2023.02); *H10B 12/488* (2023.02); *H10P 14/6339* (2026.01); *H10P 14/69433* (2026.01); *H10P 50/268* (2026.01); *H10P 50/283* (2026.01); *H10P 70/27* (2026.01); *H10P 72/0421* (2026.01); *H10W 20/43* (2026.01); *H10W 20/47* (2026.01)

(56) References Cited

U.S. PATENT DOCUMENTS

| | | | | |
|---|---|---|---|---|
| 2004/0180494 | A1* | 9/2004 | Hwang | H10B 12/0335 257/E21.507 |
| 2010/0327346 | A1 | 12/2010 | Jeong et al. | |
| 2012/0270404 | A1 | 10/2012 | Bajaj et al. | |
| 2015/0162335 | A1* | 6/2015 | Kim | H10D 1/716 438/618 |
| 2015/0170925 | A1 | 6/2015 | Chen et al. | |
| 2017/0076955 | A1* | 3/2017 | Hudson | H01J 37/32009 |
| 2018/0308923 | A1* | 10/2018 | Wu | H10D 1/042 |
| 2020/0388620 | A1* | 12/2020 | Park | H10B 12/315 |
| 2022/0051699 | A1* | 2/2022 | Fishburn | H10B 12/482 |

* cited by examiner 200A
200B
200C
200D
223
225
219
218
214
206
202A
204
202B
205
207
202C
210
212
216
220
221
222
240
242
228
224
226
243
230
202

1000

1040
Gas Source
Valve
MFC
1030
1032-1
1032-2
1032-N
1034-1
1034-2
1034-N
1036-1
1036-2
1036-N
RF Generating System
RF Generators
Plasma RF Generator
Bias RF Generator
Matching and Distribution Networks
Plasma RF Matching Network
Bias RF Matching Network
1020
1022
1023
1025
1024
1027
1029
1005
1011
1003
1007
1031
1016
1001
1002
1012
TSs
145
Valve
1056
Pump
1058
Temp Controller
1042
Power Supply Circuit
1044
System Controller
1060
Load Lock
1066
Robot
1064
Key
Electrical
Gas

SELECTIVE ETCHING AND DEPOSITION OF MEMORY LAYERS TO PROVIDE CAPACITOR-TO-ACTIVE SILICON ELECTRICAL COUPLING

CROSS-REFERENCE TO RELATED APPLICATIONS

This application is a U.S. National Phase Application under 35 U.S.C. 371 of International Application No. PCT/US2022/020478, filed on Mar. 16, 2022, which claims the benefit of U.S. Provisional Application No. 63/163,989, filed on Mar. 22, 2021. The entire disclosures of the above applications are incorporated herein by reference.

FIELD

The present disclosure relates to detecting partial unclamping of substrates from electrostatic chucks in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching and deposition processes to form memory structures, such as dynamic random access memory (DRAM) structures. During an etching process, a thin film on a substrate is etched. Etching usually includes either wet chemical etching or dry etching. Dry etching may be performed by generating inductively coupled plasma (ICP). ICP may be generated by coils arranged outside of a processing chamber adjacent to a dielectric window. Process gas flowing inside the processing chamber is ignited to create the ICP. While being etched, the substrate may be arranged on an electrostatic chuck (ESC) in a processing chamber of the corresponding substrate processing system.

SUMMARY

A substrate processing system is provided and includes a memory and a system controller. The memory is configured to store a recipe of at least a portion of an electrical coupling process for electrical coupling a capacitor to an active silicon region of a memory structure. The system controller is configured to, according to the recipe, implement the at least a portion of the electrical coupling process including: performing deposition and etch cycles to remove a portion of one or more dielectric layers from a substrate, enlarge a trench between adjacent bitline structures of the memory structure, and provide access to at least one of a polymer layer or a dielectric layer adjacent to an upper portion of the active silicon region; performing a breakthrough operation including etching the at least one of the polymer layer or the dielectric layer in the trench to expose the upper portion of the active silicon region; and performing an over-etch operation to remove the upper portion of the active silicon region to provide access for electrically coupling the capacitor to a remaining portion of the active silicon region.

In other features, the one or more dielectric layers include an oxide layer and a silicon nitride layer. In other features, deposition cycles of the deposition and etch cycles include supply of argon and at least one of unsaturated hydrocarbon molecules or saturated hydrocarbon molecules. In other features, deposition cycles of the deposition and etch cycles include supply of methane and argon.

In other features, the deposition cycles include supplying the methane and argon at a pressure greater than or equal to 5 mT and less than or equal to 40 mT. In other features, the substrate is processed in a processing chamber. The system controller refrains from applying a bias voltage to an electrode of the processing chamber during the deposition cycles.

In other features, the etch cycles of the deposition and etch cycles include supplying gases including (i) at least one of nitrogen fluoride, dichlorine, hexafluorobutadiene, fluoromethane, difluoromethane, or carbon tetrafluoride, and (ii) helium. In other features, the etch cycles include supplying the gases at a pressure greater than or equal to 5 mT and less than or equal to 30 mT. In other features, etch cycles of the deposition and etch cycles include at least one of applying continuous wave or pulsing radio frequency signals to one or more electrodes.

In other features, the breakthrough operation includes supplying carbon tetrafluoride and at least one of argon or helium. In other features, the breakthrough operation includes supplying the carbon tetrafluoride and at least one of the argon or helium at a pressure greater than or equal to 5 mT and less than or equal to 30 mT. In other features, the breakthrough operation includes at least one of applying continuous wave or pulsing radio frequency signals to one or more electrodes.

In other features, the over-etch operation includes supplying gases at a pressure greater than or equal to 200 mT and less than or equal to 400 mT. In other features, the over-etch operation includes supplying at least one of nitrogen trifluoride, hydrogen or methane. In other features, the over-etch operation includes supplying at least one of argon or helium. In other features, the over-etch operation includes supplying nitrogen trifluoride, hydrogen and methane. In other features, the over-etch operation includes at least one of applying continuous wave or pulsing radio frequency signals to one or more electrodes.

In other features, a memory structure is provided and includes: a first dielectric layer comprising an active silicon region, the active silicon region comprising an upper portion and a lower portion, where the lower portion of the active silicon region includes active silicon; a second dielectric layer disposed on the upper portion; bitline structures, where one of the bitline structures is disposed on the second dielectric layer; and a trench adjacent the active silicon region. The upper portion of the active silicon region, the trench and an area between the bitline structures is filled with an electrically conductive material, which electrically couples a capacitor to the active silicon in the active silicon region.

In other features, the upper portion of the active silicon region extends (i) in a first direction between the lower portion of the active silicon region and the second dielectric layer, and (ii) in a second direction perpendicular to the first direction between the trench and a third dielectric layer. In other features, the third dielectric layer extends at an angle along a side of the active silicon region and along a portion of the first dielectric layer.

In other features, each of the bitline structures includes: a respective conductive layer; a respective bitline disposed on the respective conductive layer; and a protective dielectric layer disposed on a top side and sides of the respective conductive layer and on sides of the protective dielectric layer.

In other features, the first dielectric layer is an oxide layer. The lower portion of the active silicon region is formed of polysilicon. Each of the bitline structures includes a respective dielectric layer formed of silicon nitride, a respective metal layer, and a respective alloy layer.

In other features, the first dielectric layer includes a second active silicon region below another one of the bitline structures. A portion of the first dielectric layer is disposed between (i) the one of the bitline structures disposed on the second dielectric layer, and (ii) the another one of the bitline structures. In other features, the first dielectric layer and the active silicon region are disposed on layers. The layers include a wordline.

In other features, the memory structure further includes layers disposed on the bitline structures and the electrically conductive material. The layers include the capacitor.

In other features, a dynamic random access memory is provided and includes: first layers comprising a wordline; an electrical coupling layer disposed on the first layers and including the memory structure; and second layers disposed on the electrical coupling layer and including the capacitor.

In other features, a method to electrical couple a capacitor to and active silicon region of a memory structure is provided. The method includes: providing a substrate including the memory structure; performing deposition and etch cycles to remove a portion of one or more dielectric layers from the substrate, enlarge a trench between adjacent bitline structures of the memory structure, and provide access to at least one of a polymer layer or a dielectric layer adjacent to an upper portion of the active silicon region; performing a breakthrough operation including etching the at least one of the polymer layer or the dielectric layer in the trench to expose the upper portion of the active silicon region; and performing an over-etch operation to remove the upper portion of the active silicon region to provide access for electrically coupling the capacitor to a remaining lower portion of the active silicon region.

In other features, the memory structure includes: a first dielectric layer including the active silicon region; the bitline structures; and the trench adjacent the active silicon region. The lower portion of the active silicon region includes active silicon. A second dielectric layer is disposed on the upper portion. One of the bitline structures is disposed on the second dielectric layer. In other features, the method further includes filling the trench and an open area remaining after removal of the upper portion of the active silicon region with an electrically conductive material for electrically coupling the capacitor to the active silicon in the active silicon region. In other features, the one or more dielectric layers include an oxide layer and a silicon nitride layer.

In other features, deposition cycles of the deposition and etch cycles include supply of methane and argon. In other features, deposition cycles of the deposition and etch cycles include supplying methane and argon. In other features, the deposition cycles include supplying the methane and argon at a pressure greater than or equal to 5 mT and less than or equal to 40 mT.

In other features, the method further includes refraining from applying a bias voltage to an electrode of a processing chamber during the deposition cycles, where the substrate is processed in the processing chamber. In other features, the etch cycles of the deposition and etch cycles include supplying gases including (i) at least one of nitrogen fluoride, dichlorine, hexafluorobutadiene, fluoromethane, difluoromethane, or carbon tetrafluoride, and (ii) helium. In other features, the etch cycles include supplying the gases at a pressure greater than or equal to 5 mT and less than or equal to 30 mT. In other features, etch cycles of the deposition and etch cycles include at least one of applying continuous wave or pulsing radio frequency signals to one or more electrodes.

In other features, the breakthrough operation includes supplying carbon tetrafluoride and at least one of argon or helium. In other features, the breakthrough operation includes supplying the carbon tetrafluoride and at least one of the argon or helium at a pressure greater than or equal to 5 mT and less than or equal to 30 mT. In other features, the breakthrough operation includes at least one of applying continuous wave or pulsing radio frequency signals to one or more electrodes.

In other features, the over-etch operation includes supplying gases at a pressure greater than or equal to 200 mT and less than or equal to 400 mT. In other features, the over-etch operation includes supplying at least one of nitrogen trifluoride, hydrogen or methane. In other features, the over-etch operation includes supplying at least one of argon or helium. In other features, the over-etch operation includes supplying nitrogen trifluoride, hydrogen and methane. In other features, the over-etch operation includes at least one of applying continuous wave or pulsing radio frequency signals to one or more electrodes.

In other features, the method further includes: cleaning the trench and the upper portion of the active silicon region; and filling the trench and the upper portion of the active silicon region with an electrically conductive material to provide a conductive element electrically coupling the capacitor to the remaining lower portion of the active silicon region. In other features, the method further includes forming layers on the bitline structures and the conductive element, where the layers include the capacitor.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
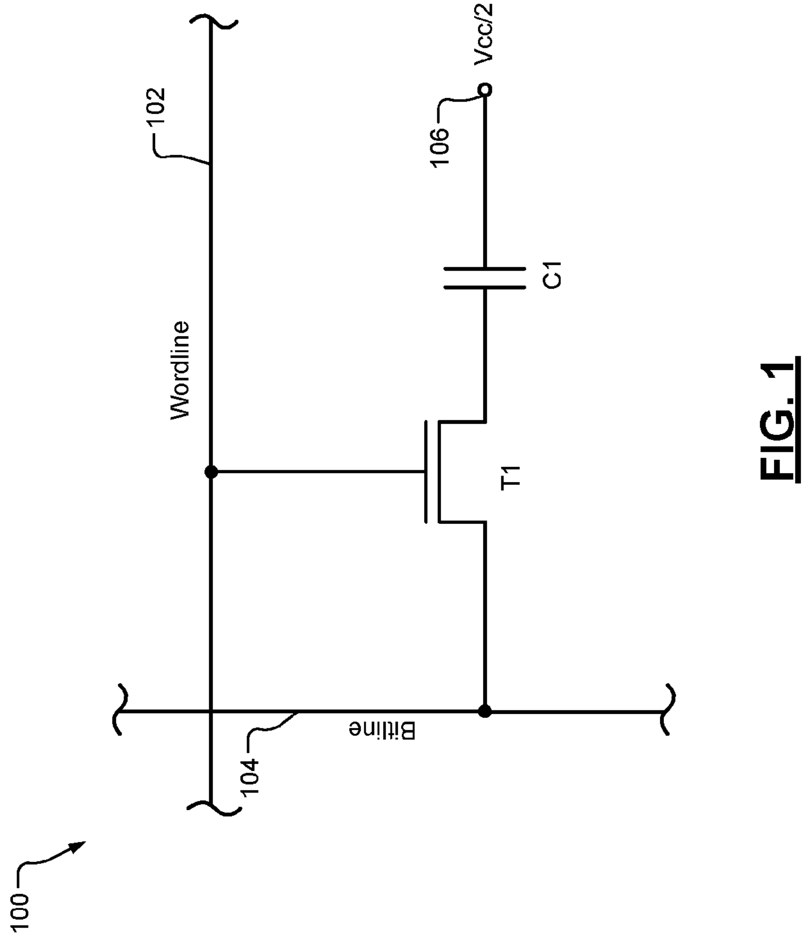
FIG. 1 is an example memory cell of a DRAM.

FIG. 1 shows a memory cell 100 of a DRAM that includes a transistor T1 and a capacitor C1. The transistor T1 includes a gate, a first terminal and a second terminal. The gate is connected to a wordline 102. The first terminal is connected to a bitline 104. The second terminal is connected to the capacitor C1, which is connected to a reference terminal 106. The reference terminal 106 may be at a voltage equal to a common collector voltage Vcc/2. When a bit is stored in the memory cell 100, the transistor T1 charges or discharges the capacitor C1. The charging and discharging is performed by controlling states of the wordline 102 and the bitline 104. The bit stored in the memory cell may be read via a sense amplifier (not shown). The DRAM includes an array of memory cells configured as the memory cell 100.

Figure 2:
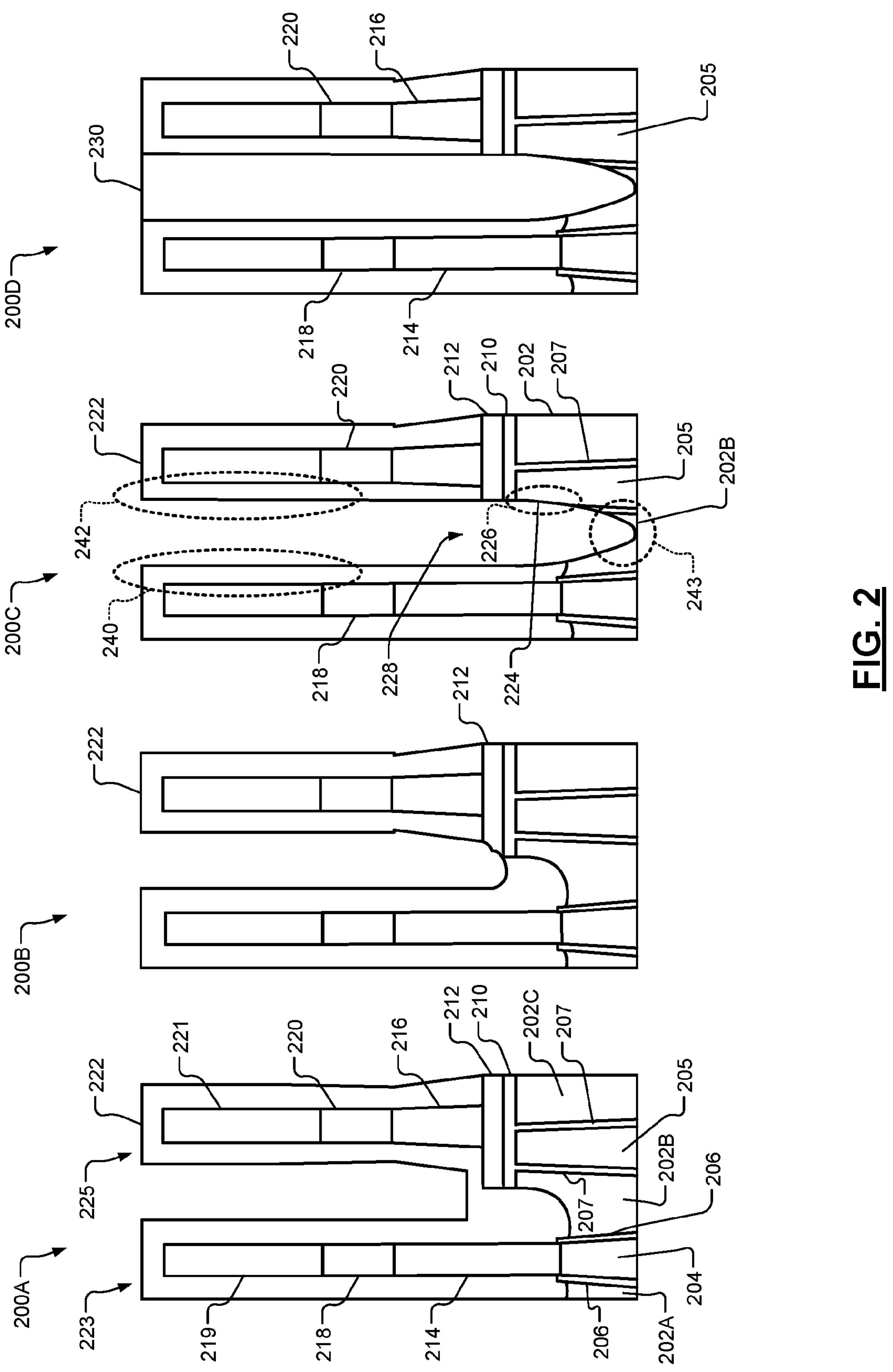
FIG. 2 is an example process diagram showing a cross-sectional view of a memory structure at stages of an electrical coupling process for electrically coupling a capacitor to active silicon region.

FIG. 2 shows a memory structure at stages of an electrical coupling process for electrical coupling a capacitor to an active silicon region. At an initial stage, the memory structure 200A includes an oxide layer 202 (portions 202A, 202B, 202C are shown) with active silicon regions 204, 205. The active silicon regions 204, 205 are conductive. The active silicon regions 204, 205 are portions of and/or electrically coupled to respective transistors of memory cells of a memory (e.g., a DRAM). As an example, each of the memory cells may be configured as shown in FIG. 1. Inter dielectric layers (IDLs) 206, 207 are disposed on sides of the active silicon regions 204, 205, respectively. One or more IDLs (IDLs 210, 212 are shown) may be disposed on the IDL 207. An intermediate layer 214 may be disposed on and directly contact the active silicon region 204. An intermediate layer 216 may be disposed on the IDL 212. The intermediate layers 214, 216 may include poliysilicon and/or silicon germanium (SiGe). Bitline layers 218, 220 may be formed on the intermediate layers 214, 216, respectively. The bitline layers 218, 220 may be formed of tungsten (W). The bitline layers 218, 220 perform as bitlines of respective memory cells. Hardmask layers 219, 221 are disposed on the bitline layers 218, 220. The hardmask layers 219, 221 may be formed of silicon nitride (SIN). The hardmask layers 219, 221 may be formed by plasma chemical vapor deposition (PCVD). An IDL 222 is disposed over portions of the layers 202, 206, 210, 212, 214, 216, 218, 219, 220, 221 and may be formed of SiN, which is a non-conductive (or dielectric) material. The IDL 222 may be formed by atomic layer deposition (ALD). The intermediate layer 214, the bitline layer 218 and a corresponding portion of the IDL 222 form a first bitline structure 223. The intermediate layer 216, the bitline layer 220 and another corresponding portion of the IDL 222 form a second bitline structure 225.

In order to expose a portion of the active silicon region 205 to form an electrical coupling (or conductive element) for electrically coupling to a capacitor, portions of the layers 202, 207, 210, 212, and 222 are etched during multiple etch cycles. Memory structure 200B illustrates an end of one intermediate etch cycle and memory structure 200C illustrates an end of the etch cycles. The memory structure 200B may be the end of a first etch cycle illustrating partial etching away of a portion of the layers 212, 222. Memory structure 200C illustrates the resulting etching away of portions of the layers 202 (or 202B), 207, 210, 212 and 222 to expose a portion 224 of the active silicon region 205. The exposed portion 224 of the active silicon region 205 is in area 226 within a trench 228 etched away during the etch cycles.

The memory structure 200D illustrates the filling of an area between the hardmask layers 219, 221, an area between the bitline layers 218, 220, an area between the intermediate layers 214, 216, and other areas etched away during previous operations. A deposition operation is performed to fill the stated areas with an electrically conductive filler material (e.g., a polycrystalline silicon (also referred to as polysilicon or poly-Si) 230 and/or other metal-doped version of silicon), which contacts the exposed portion of the active silicon region 205. The polysilicon is electrically conductive. One example of a metal-doped electrically conductive silicon is cobalt silicide ($CoSi_x$). Subsequent layers may then be deposited on the memory structure 200D to form a capacitor that is in electrical contact with the polysilicon and thus the active silicon region 205.

During the above-described electrical coupling process etching is performed deep enough into the memory structure to expose the active silicon region 205. During the process, there is a risk that the IDL 222 will be etched too much causing exposure of portions of the bitline layers 218, 220. For example, if the IDL 222 is etched too much in areas 240, 242, an electrical short between the capacitor and the one of the bitlines can occur. The electrical short occurs due to the polysilicon (or electrically conductive material) filling the space between the exposed one or more bitline layers 218, 220 and a conductor electrically coupled to or part of the capacitor. In addition, if the etching continues too deep into the memory structure in a trench area indicated by circle 243, another electrical short can occur between the capacitor and a wordline due to the polysilicon contacting the wordline. The wordline may be disposed in a layer below the shown portion 202B of the oxide layer 202. Too much etching of the portion 202B can lead to etching a portion of the IDL 206 and/or the IDL 207, which may extend (i) horizontally over the wordline below the portion 202B, and (ii) between the portion 202B and the wordline. The etching of the IDL 206 and/or the IDL 207 can lead to exposure of a portion of the wordline and as a result contact between the polysilicon and the wordline.

Figure 3:
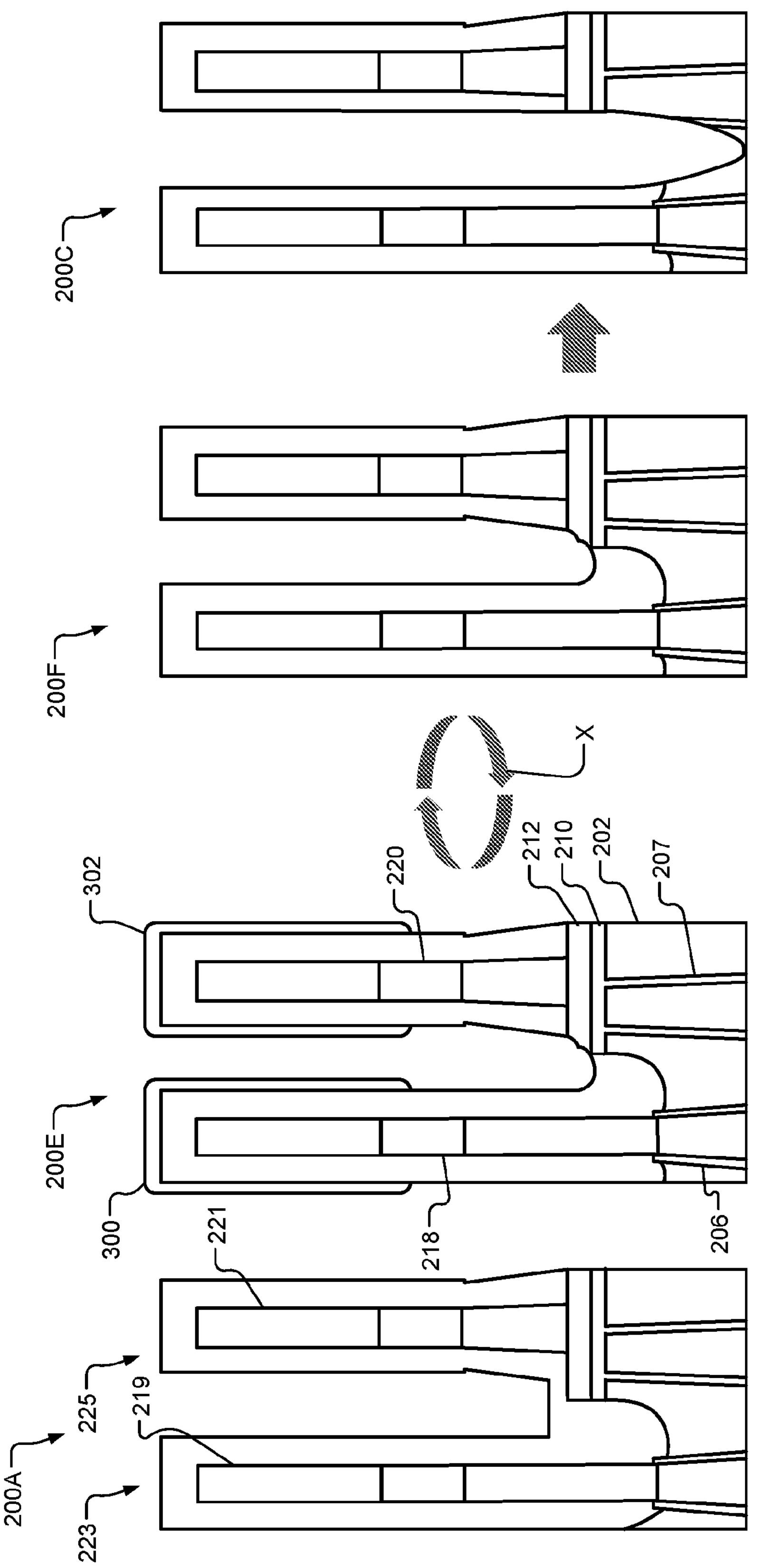
FIG. 3 is an example process diagram showing a cross-sectional view of the memory structure illustrating stages of multiple cycles of the electrical coupling process of FIG. 2.

FIG. 3 shows a process diagram including the memory structure 200 illustrating stages during multiple cycles of the electrical coupling process. The initial memory structure 200A is shown followed by a memory structure 200E, which illustrates an intermediate deposition step. The deposition step is followed by an etch step, which is illustrated by memory structure 200F. Performance of 4-10 cycles of the deposition and etch steps results in the memory structure 200C. The memory structure 200*c* shows the memory structure 200 prior to performing a contact fill operation to fill the area between the bitline structures 223, 225 and lower areas in which material has been etched away.

The memory structure 200E illustrates deposition of protective layers 300, 302 on the bitline structures 223, 225. The protective layers 300, 302 have a 'C'-shaped cross section and cover top portions of the bitline structures 223, 225. The protective layers 300, 302 are deposited to protect underlying portions of the IDL 222 disposed over at least portions of the bitline layers 218, 220 during a subsequently performed etch operation. This allows for etching portions of the layers 202, 207, 210, 212 as described above without creating an electrical short circuit pathway between a capacitor and one of the bitline layers 218, 220. The protective layers 300, 302 may extend down to cover and protect sides of the hardmask layers 219, 221, at least portions of the sides of the bitline layers 218, 220, and at least portions of areas of the IDL layer 222 on sides of the hardmask layers 219, 221 and on sides of at least portions of the bitline layers 218, 220.

The electrical coupling process described with respect to FIGS. 2-3 includes etching away material in an attempt to create a 'U'-shaped profile to maximize an active silicon contact area when filled with an electrically conductive material. This process may be performed concurrently for an array of active silicon regions. Due to incoming material variability and topography differences, the aspects of etch operations become critical in ensuring that for each contact being formed at a respective one of the active silicon regions there is an active silicon region exposed. Any poor active silicon opening can result in complete loss of contact between electrically conductive filler material and a corresponding active silicon region. Due to small critical dimension requirements and topography variability of memory structures, the electrical coupling process needs to etch deep into the memory structure to ensure enough active silicon is exposed to provide a reliable connection interface. The connection interface is between electrically conductive filler material and the active silicon region.

The examples set forth herein include an electrical coupling process for electrical coupling a capacitor to an active silicon region including a highly selective etch process that etches out portions of active silicon regions while minimizing etching of dielectric layers. The dielectric layers include oxide and silicon nitride layers. The areas in which portions of the active silicon regions have been removed are filled with an electrically conductive material (e.g., a polysilicon, $CoSi_x$, and/or other metal doped silicon). This provides interfaces with large contact surface areas. The interfaces are between the electrically conductive material and the remaining portions of the active silicon regions. The stated process also significantly reduces resistances of the interfaces as compared to active silicon region contact interfaces provided by the process described with respect to FIGS. 2-3. The examples include selectively etching active silicon regions while minimizing etching of other adjacent layers such that depths of the adjacent layers are shallow. This prevents creating electrically conductive short circuit paths. Active silicon regions are "dug out" to the appropriated depths for increased surface areas of active silicon for electrically coupling contacts. The electrical coupling contacts are created with electrically conductive filler material. The increased surface areas improve electrical connections with corresponding capacitors.

Figure 4:
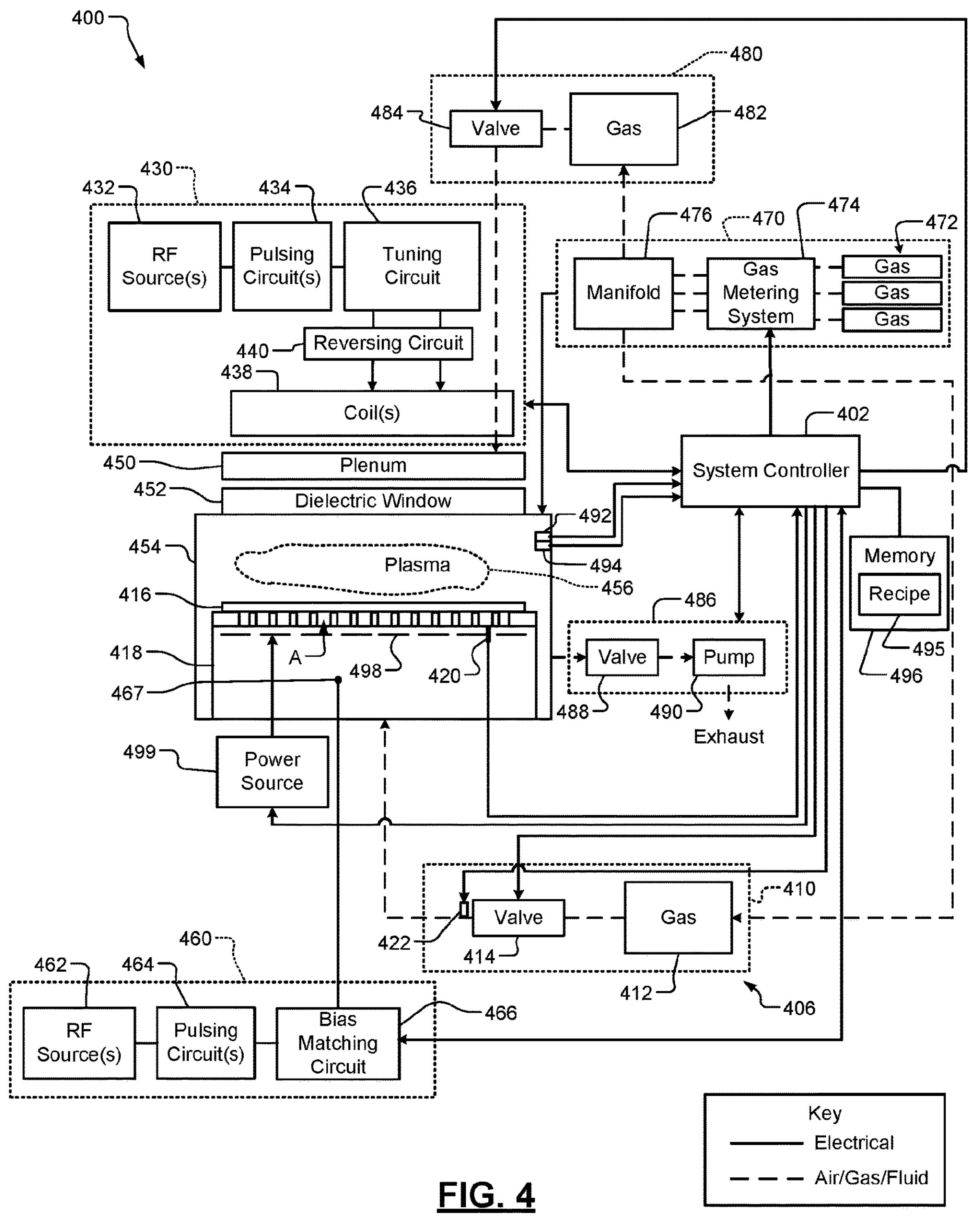
FIG. 4 is a functional block diagram of an example of a substrate processing system incorporating a system controller implementing selective etch and deposition cycles in accordance with an embodiment of the present disclosure.

FIG. 4 shows a substrate processing system 400. Although FIG. 4 shows an inductively coupled plasma (ICP) substrate processing system, the embodiments disclosed herein are applicable to transformer coupled plasma (TCP) systems and/or other substrate processing systems. The substrate processing system 400 incorporates a system controller 402 implementing an electrical coupling process for electrical coupling a capacitor to an active silicon region. The electrical coupling process includes etch and deposition cycles, as well as breakthrough and over-etch operations. The cycles and operations are performed to provide electrical coupling paths between active silicon regions and capacitors within minimal resistances therebetween. The electrical coupling process is described below with respect to FIGS. 5-8.

The substrate processing system 400 of FIG. 4 may include a backside gas circuit 406. The backside gas circuit 406 may include the system controller 402 and a first gas delivery system 410. The first gas delivery system 410 includes a gas source 412 and a valve 414. The system controller 402 controls operation of the valve 414 to maintain a predetermined pressure of a backside gas (e.g., helium) being supplied from the first gas delivery system 410 to an area A between a substrate 416 and an ESC 418. Although an example ESC 418 is shown, the examples disclosed herein are applicable to other ESCs. The system controller 402 may adjust the position (or opening) of the valve 414 based on a pressure of the backside gas. The system controller 402 may adjust the pressure and/or the flow rate of the backside gas to adjust a temperature of the substrate 416. In an embodiment, one or more temperature sensors may be used to detect temperatures of the backside gas. A couple of example temperature sensors 420, 422 are shown. The pressure and/or flow rate of the backside gas may be adjusted based on the detected temperatures. The system controller 402 may determine a flow rate (e.g., an absolute flow rate and/or a mass flow rate) of the backside gas. If a mass flow rate is determined, the mass flow rate may be determined based on the temperatures detected by the temperature sensors 420, 422.

The substrate processing system 400 further includes a coil driving circuit 430. In some examples, the coil driving circuit 430 may include an RF source 432, a pulsing circuit 434, and a tuning circuit 436. The pulsing circuit 434 controls a TCP envelope of a RF signal and varies a duty cycle of the TCP envelope during operation.

The tuning circuit 436 may be directly connected to one or more inductive coils 438. Alternatively, the tuning circuit 436 may be connected by an optional reversing circuit 440 to one or more of the coils 438. The tuning circuit 436 tunes an output of the RF source 432 to a set frequency and/or a set phase, matches an impedance of the coils 438 and splits power between the coils 438. The reversing circuit 440 is used to selectively switch the polarity of current through one or more of the coils 438.

In some examples, a plenum 450 may be arranged between the coils 438 and a dielectric window 452 to control the temperature of the dielectric window 452 with hot and/or cold air flow. The dielectric window 452 is arranged along one side of a processing chamber 64. The processing chamber 454 includes the ESC 418. Process gas is supplied to the processing chamber 454 and plasma 456 is generated inside of the processing chamber 454. The plasma 456 etches an exposed surface of the substrate 416. The substrate processing system 400 may further include a RF bias circuit 460. The RF bias circuit 460 may include an RF source 462, a pulsing circuit 464 and a bias matching circuit 466, which may be used to bias the ESC 418. The biasing matching circuit 466 may be connected to an electrode 467 in the ESC 418.

A gas delivery system 470 may be used to supply a process gas mixture to the processing chamber 454 and various gases referred to herein. The gas delivery system 470 may include process and inert gas sources 472, a gas metering system 474, such as valves and mass flow controllers, and a manifold 476. Another gas delivery system 480 may be used to deliver a gas from a gas source 482 via a valve 484 to the plenum 450. The gas may include cooling gas (air) that is used to cool the coils 48 and the dielectric window 452. An exhaust system 486 includes a valve 488 and pump 490 to remove reactants from the processing chamber 454 by purging or evacuation.

A voltage (V) and current (I) probe (or VI probe) 492 is arranged in the processing chamber 454 to detect voltage and current of the plasma 456. In addition, a phase/magnitude detector 494 is arranged in the processing chamber 454 to detect a phase and magnitude of the plasma 456.

The system controller 402 may be used to control processing of the substrate 416. The system controller 402 monitors system parameters and controls delivery of the gas mixture, striking, maintaining and extinguishing the plasma 456, removal of reactants, supply of cooling gas, etc. Additionally, the system controller 402 may control various aspects of the coil driving circuit 430 and the RF bias circuit 460.

The system controller 402 may control processing of the substrate 416 according to a recipe 495 stored in a memory 496. The recipe 495 may be for any electrical coupling process referred to herein. The recipe 495 defines operating parameters such as: timing of delivery of one or more gases and/or one or more gas mixtures; valve control timing; RF power timing; RF bias timing; power levels of current supplied to heaters (or thermal control elements); RF power source activation/deactivation timing, frequency and power levels; RF bias source activation/deactivation timing, frequencies and power levels; flow rates; etc. While executing an electrical coupling process, the system controller 402 may receive feedback values from one or more sensors and control one or more actuators. Examples of sensors include temperature sensors, pressure sensors, flow rate sensors, etc., at least some of which are stated above. Examples of actuators include mass flow controllers, valves, resistive heating elements, RF bias source(s), RF power source(s), and/or other actuators, at least some of which are stated above. The system controller 402 follows the recipe and may make adjustments to the actuators based on the feedback from the sensors.

The ESC 418 may include one or more electrodes (or an electrode array) 498. The one or more electrodes 498 may be connected to and receive power from a power source 499, which may be controlled by the system controller 402. The one or more electrodes 498 may be used to control an amount of electrostatic force created to clamp the substrate 416 to the ESC 418.

Figure 5:
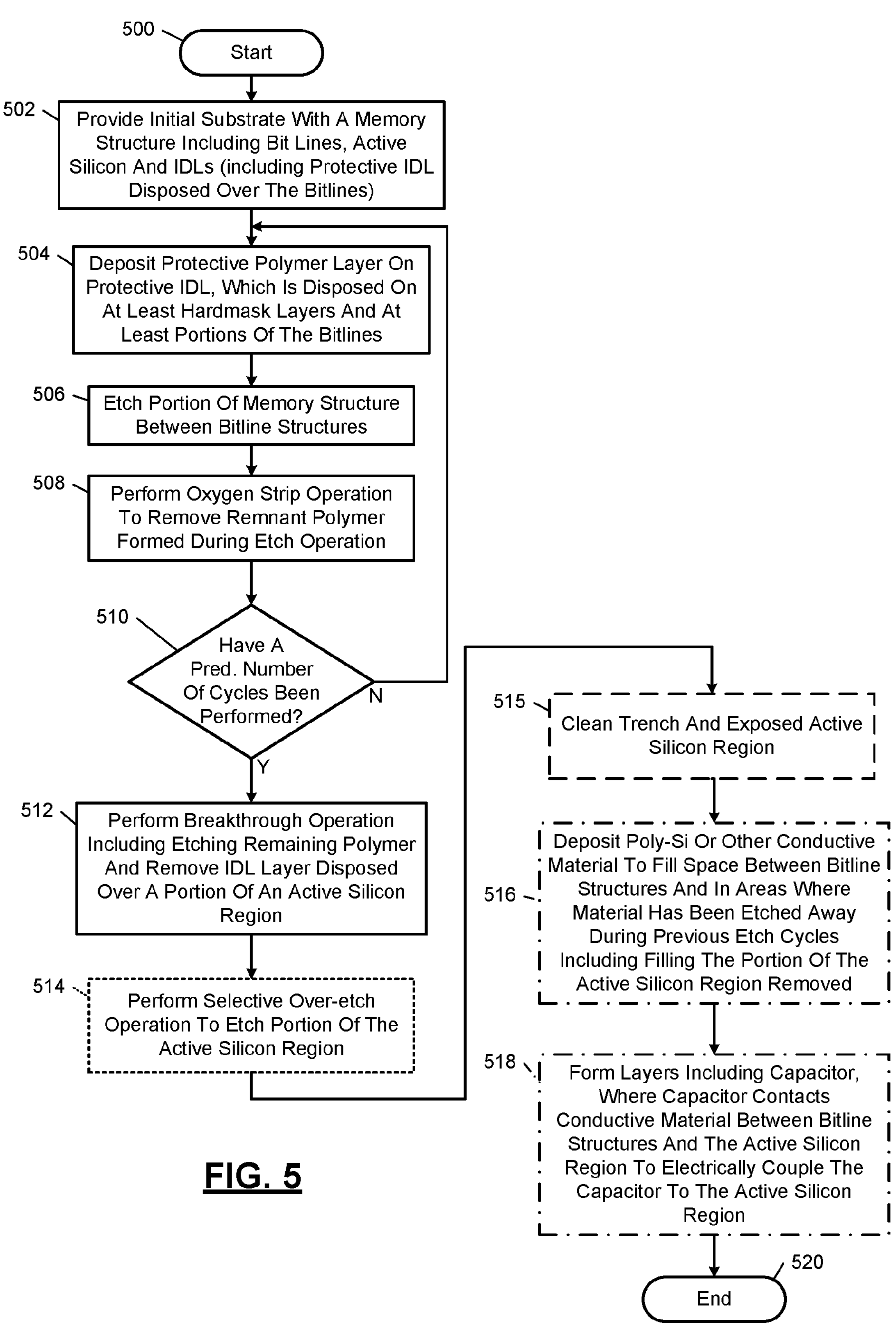
FIG. 5 illustrates an example electrical coupling method for electrically coupling a capacitor to an active silicon region in accordance with an embodiment of the present disclosure.

In FIG. 5, an electrical coupling method (or process) for electrical coupling a capacitor to an active silicon region is shown. Although the following operations are primarily described with respect to the implementations of FIGS. 4-8, the operations may be easily modified to apply to other implementations of the present disclosure. The operations may be iteratively performed and are described primarily with respect to FIGS. 6-7, which show memory structures 600A-600G of a single memory structure 600 at various stages of the process and in general order of operations performed. Although the following operations are described with respect to a single memory structure including a finite number of bitline structures, active silicon regions and corresponding layers, the method may be performed concurrently for any number of memory structures, bitline structures, and active silicon regions.

The method may begin at 500 and be performed by the system controller 402 and the substrate processing system 400 of FIG. 4. At 502, an initial substrate with a memory structure 600A (shown in FIG. 6) is provided and disposed on the ESC 418. At an initial stage, the memory structure 600A includes an oxide layer 602 (portions 602A, 602B, 602C are shown) with active silicon regions 604, 605. The active silicon regions 604, 605 are portions of and/or electrically coupled to respective transistors of memory cells of a memory (e.g., a DRAM). As an example, each of the memory cells may, upon completion of formation, be configured as shown in FIG. 1. IDLs 606, 607 are disposed on sides of the active silicon regions 604, 605, respectively. One or more IDLs (IDLs 610, 612 are shown) may be disposed on the IDL 607. An intermediate layer 614 may be disposed on and directly contact the active silicon region 604. An intermediate layer 616 may be disposed on the IDL 612. The intermediate layers 614, 616 may be formed of polysilicon and/or SiGe. Bitline layers 618, 620 may be formed on the intermediate layers 614, 616, respectively. The bitline layers 618, 620 may be formed of a metal, such as tungsten (W). The bitline layers 618, 620 perform as bitlines of respective memory cells. Hardmask layers 619, 621 are disposed on the bitline layers 618, 620. The hardmask layers 619, 621 may be formed of SiN. The hardmask layers 619, 621 may be formed by PCVD. An IDL 622 is disposed over portions of the layers 602, 606, 610, 612, 614, 616, 618, 619, 620, 621 and may be formed of SiN. The IDL 222 may be formed by ALD. The intermediate layer 614, the bitline layer 618 and a corresponding portion of the IDL 622 form a first bitline structure 623. The intermediate layer 616, the bitline layer 620 and a corresponding portion of the IDL 622 form a second bitline structure 625.

The initial structure may also include a base layer 800 (shown in FIG. 8) and multiple intermediate layers (e.g., intermediate layers 802, 804, 806 are shown) disposed between (i) the base layer and (ii) the oxide layer 602, the active silicon regions 604, 605 and the IDLs 606, 607. One of the intermediate layers may include or be implemented as a wordline, such as one of the intermediate layers 804 or 806.

When etching to expose an active silicon region, an oxide layer and a silicon nitride layer tend to etch away at a different rate than the active silicon region. This makes it difficult to expose a large amount of active silicon. As stated above, this can result in an electrical short between a capacitor and a bitline and/or the capacitor and a wordline. The process disclosed herein includes as similarly described above performing multiple etch and deposition cycles to expose (i) an active silicon region, and/or (ii) a thin polymer layer over an active silicon region. The thin polymer layer may be formed due to the multiple etch and deposition cycles. Subsequent to the etch and deposition cycles, the system controller 402 performs a breakthrough operation followed by an over-etch operation. This is further described below with respect to the operations of FIG. 5 and the structures shown in FIGS. 6-8.

Figure 7:
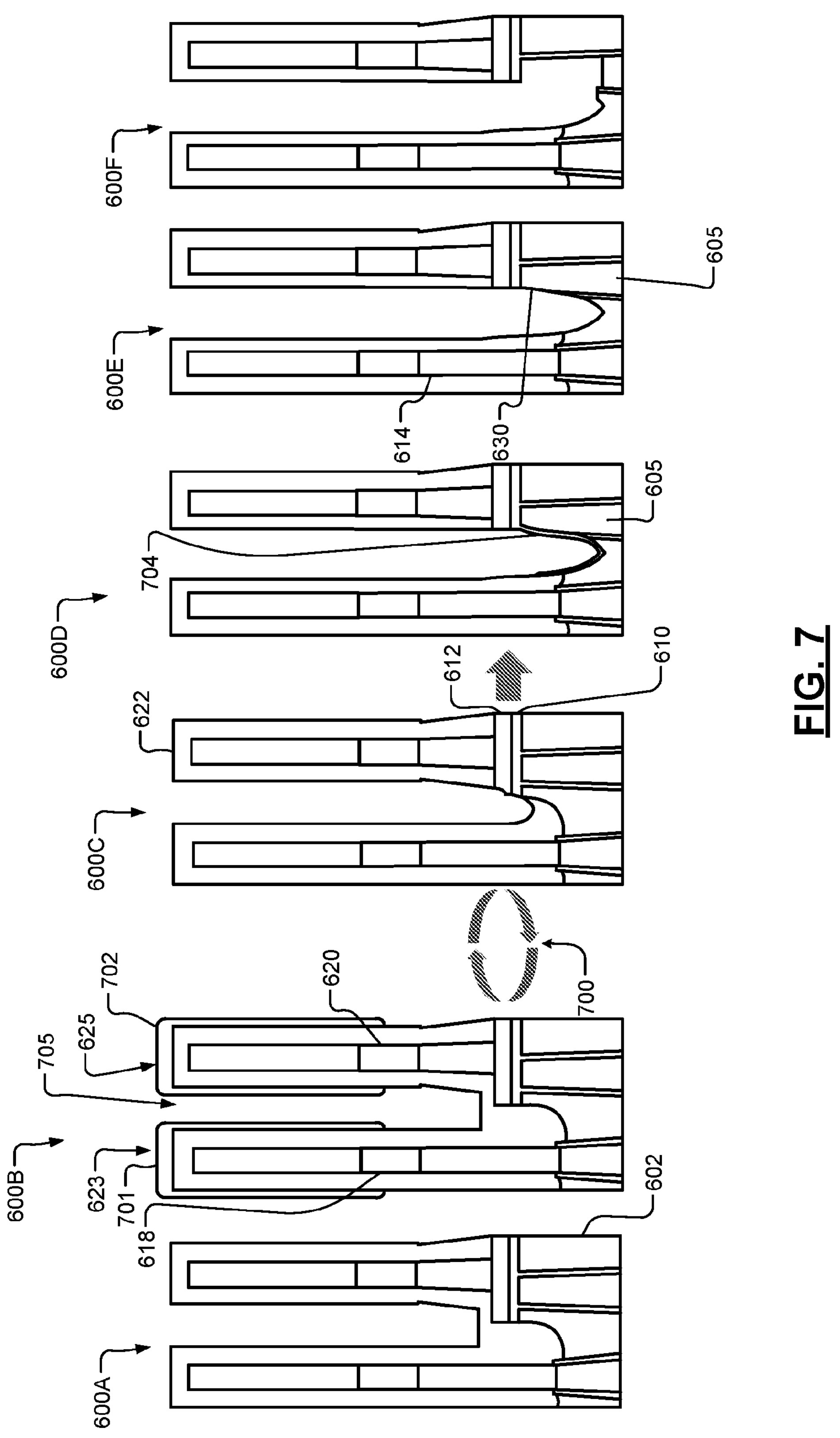
FIG. 7 is an example process diagram showing a cross-sectional view of the memory structure illustrating deposition and etch cycles and breakthrough and over-etch operations of the electrical coupling method of FIG. 5.
Figure 8:
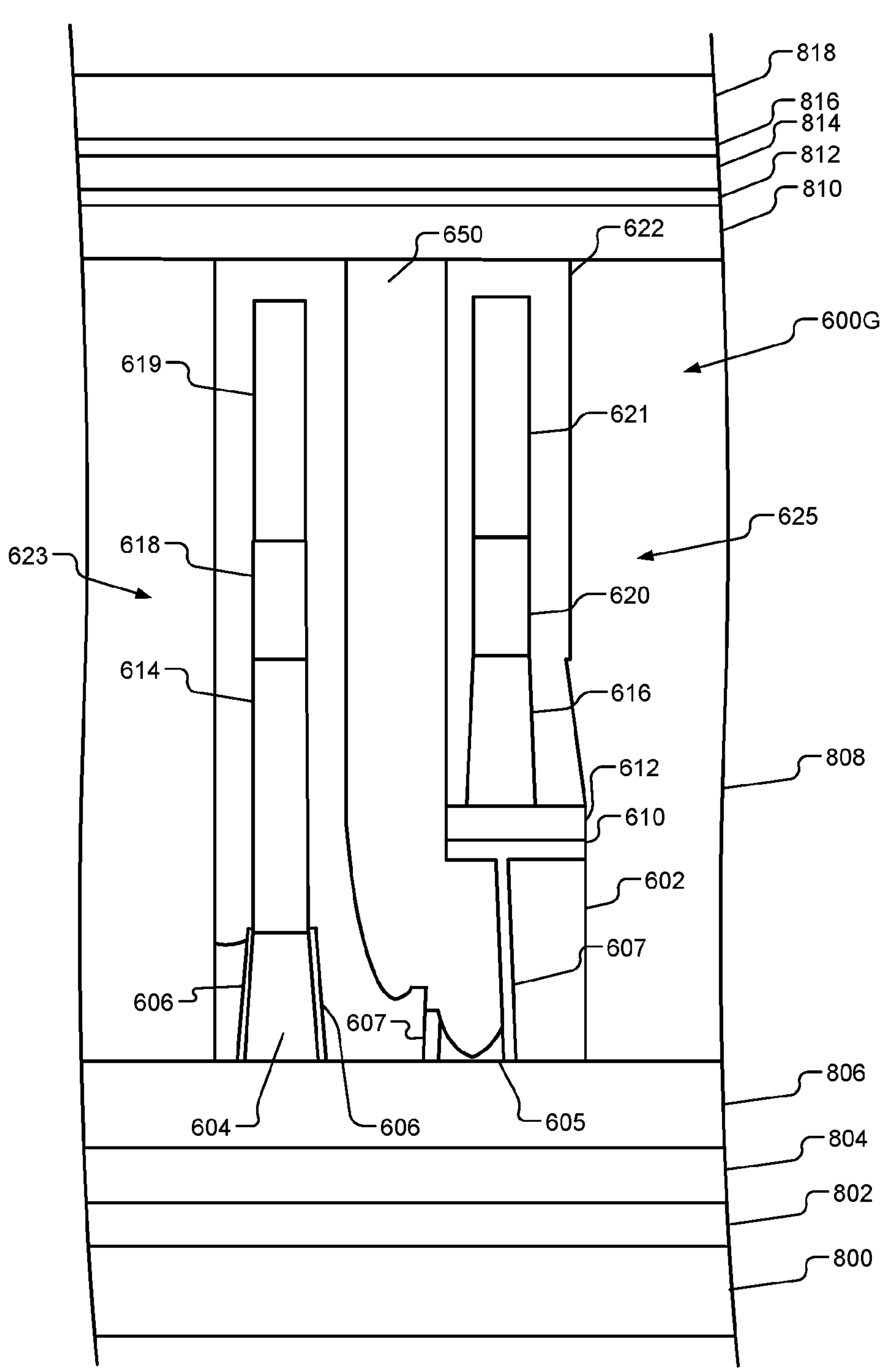
FIG. 8 is an example cross-sectional view of a memory structure including a capacitor-to-active silicon region electrically coupling layer formed according to the method of FIG. 5.

Subsequent to operation 502 a predetermined number of deposition and etch cycles are performed as represented by arrow 700. The deposition cycles are each performed at 504, which is illustrated by structure 600B of FIG. 7. During each deposition cycle, a protective carbon based polymer layer is formed over at least top portions of the bitline structures 623, 625 to protect at least a portion of layer 622 and as a result protect at least a top portion of the bitline layers 618, 620. The IDL layer 622 is referred to as the top sidewall spacer. In FIG. 7, the protective polymer layers 701, 702 are shown on the bitline structures 623, 625. The protective layers 701, 702 may extend down to cover and protect sides of the hardmask layers 619, 621, sides of at least portions of the bitline layers 618, 620, and at least portions of areas of the IDL layer 622 on sides of the hardmask layers 619, 621 and sides of at least portions of the bitline layers 618, 620.

As an example, the deposition operation may be performed with chemistry pressure of 5-40 milli-Torr (mT) and include use of methane ($CH_4$) and Argon (Ar). As an example, the duration of the deposition operation may be 4-10 seconds in length. A top side electrode, such as one of the coils 438 of FIG. 4 may be at 500-1500 Watts (W). A bottom side electrode, such as the electrode 467 may be at zero bias and/or at a reference bias level (e.g., ground). The deposition operation is at zero bias to deposit dielectric material at the top of the bitline structures 623, 625 and not at the bottom of a trench 705 or to deposit more material near the top of the bitline structures 623, 625 and not at the bottom of the trench 705. The deposition operation may include depositing some material at the bottom of the trench 705. The amount of material deposited at the bottom of the trench 705 may be less than the amount of material deposited at the top of the trench 705 and/or at the top of the bitline structures 623, 625. The amount of deposited material along sides of the layers 614, 616, 618, 619, 620, 621 may decrease with increase in depth such that there is a varying thickness of deposited material from the top of the trench 705 down to the bottom of the trench 705, where the most material deposited is at or near the top of the trench 705 and the least amount of material deposited is at or near the bottom of the trench 705. The trench is at least partially located between the bitline structures 623, 625. Deposition RF conditions are set to deposit polymer on top of the bitline structures 623, 625.

Each etch cycle is implemented at 506 during which a portion of an area between the bitline structures and portions of the layers 602, 610, 612, 622 are etched. Memory structure 600C (shown in FIGS. 6-7) illustrates an end of one intermediate etch cycle, where a portion of the layers 610, 612, 622 have been removed. Memory structure 600D (shown in FIG. 7) illustrates an end of the etch cycles. As shown by the memory structure 600D, the etch cycles result in an accessible thin polymer layer 704 on the active silicon region 605. As shown by the memory structure 600E (shown in FIGS. 6-7) a shallow etch process is performed by the etch cycles to expose a portion of the active silicon region 605. This may occur at 508 and/or 512.

Each of the etch cycles may include chemistry pressures between 5-30 mT and include nitrogen fluoride ($NF_3$), dichlorine ($Cl_2$), hexafluorobutadiene ($C_4F_6$), fluoromethane ($CH_3F$), difluoromethane ($CH_2F_2$), and/or carbon tetrafluoride ($CF_4$). The chemistry may also include helium (He). The duration of each etch operation may be 5-12 seconds. The stated deposition and etch operation durations are provided as examples, which are applicable for critical dimensions of memory structures and implemented to minimize damage to a sidewall spacer (e.g., layer 622). The times may be different for other structures. The top electrode may be at 500-1500 W. The bottom electrode may be biased at 500-1500 volts (V). The top electrode and the bias (or bottom) electrode may be concurrently pulsed while operating in a synchronous mode or at different times while operating in an asynchronous mode. In another embodiment, the pulsing includes providing two greater than 0 V pulses at two different non-zero voltage levels (e.g., transformer coupled plasma (TCP) can be pulsed between 500 W and 1500 W and the bias voltages may be between 500-1500 V). During synchronous and asynchronous modes, the pulsing may be between high and low bias voltages, where the low bias voltage may be 0V or greater than 0V. The synchronous mode may refer to the high and low voltage signals are in phase (or have matching phase). The asynchronous mode may refer to when the high and low voltage signals are not in phase (e.g., 180° out of phase). In another embodiment, the recipe may call for continuous wave operation for both the top electrode and the bias electrode. The continuous wave operation may be performed for transformer coupled plasma etching and while providing a bias voltage. At 508, the system controller 402 may perform an oxygen strip operation to remove remnant polymer formed during a previous etch operation.

Durations of operations 504, 506 and 508 are short. Example durations are provided above for the deposition and etch operations. Operations 504, 506 and 508 are iteratively performed to protect layer 622, while etching a bottom trench profile down to the active silicon region 605 and removing remnant polymer formed during etching.

At 510, the system controller 402 determines whether the predetermined number of deposition and etch cycles have been performed and/or whether a sufficient depth level has been achieved where active silicon is exposed. If yes, operation 512 is performed, otherwise operation 504 is performed.

At 512, the system controller 402 performs a breakthrough operation including etching remaining polymer, such as layer 704 and/or removing a portion of the IDL layer 607 disposed over the active silicon region 605. Memory structure 600E illustrates a result of the breakthrough operation, which exposes a portion 630 of the active silicon region 605. The portion 630 is (i) in an area 631 between a portion of the active silicon region 605 and a portion of the intermediate layer 614, and (ii) within a trench area 632 formed by the previously performed etched cycles.

The breakthrough operation uses low-pressure plasma and a certain chemistry as part of a "Si punch" scheme to etch through to the active silicon region 605. As an example, the chemistry for the breakthrough operation may include carbon tetrafluoride (CFO) and one or more of argon (Ar) and Helium (He). The chemistry may be at 5-30 mT. The top electrode may be at 500-1000 W. The bias voltage may be 50-200 V. The top and bottom electrodes may provide a continuous wave and/or pulsed wave signals while operating in synchronous and/or asynchronous modes. In another embodiment, the pulsing includes providing two greater than 0 V pulses at two different voltage levels (e.g., transformer coupled plasma (TCP) can be pulsed between 500 W and 1500 W and the bias voltages may be between 500-1500 V). During synchronous and asynchronous modes, the pulsing may be between high and low bias voltages, where the low bias voltage may be 0V or greater than 0V.

At 514, the system controller 402 may perform a selective over-etch operation to etch a portion of the active silicon region 605. In one embodiment, operation 514 is performed by the substrate processing system 400 and the system controller 402 performs the selective over-etch operation in the same processing chamber as the previously performed operations. In another embodiment, operation 514 is performed in a different processing chamber and/or in a different substrate processing system. The box for operation 514 in FIG. 5 is dashed to indicate that operation 514 may be performed in a different processing chamber than the previous operations. Performing operation 514 in the same processing chamber minimizes processing time.

A result of operation 514 is illustrated by memory structure 600F, which shows an upper portion 633 of the active silicon region and portions of the layers 602 and 607 removed. The upper portion 633 may refer to the active silicon removed and/or an upper area of the active silicon region in which active silicon is removed. This increases size of a breakthrough area and the active silicon region that is removed. The removed portion of the active silicon region was below layers 610 and 612 and within circle 640. A bottom portion 635 of the active silicon region 605 that is below the upper portion 633 remains. The bottom portion 635 may refer to the remaining active silicon and/or a lower area of the active silicon region in which the corresponding active silicon is disposed. The periphery of the upper portion 633, prior to removal, is defined (i) on an upper side by the IDL 610, (ii) on sides by the IDL 607, and (iii) on a bottom side by the remaining bottom (or lower) portion 635. The upper portion 633 may be trapezoidal-shaped. The upper portion 633, prior to removal, is disposed between portions of the oxide layer 602 (e.g., portions 602B and 602C) and is adjacent to the trench area 632 of the enlarged trench 705'. The etched away area of the active silicon region 605 corresponding to the upper portion 633 extends (i) in a first (or vertical) direction between the lower portion 635 of the active silicon region 605 and a first dielectric layer (e.g., IDL 610), and (ii) in a second (or horizontal) direction perpendicular to the first direction between the trench 705' and a second dielectric layer (e.g., IDL 607). The second dielectric layer extends along a portion of a third dielectric layer (e.g., the portion 602C of the oxide layer 602).

The over-etch operation uses high pressure plasma along with a certain chemistry to etch silicon at fast etch rates while not etching or minimizing etching of other materials, such as oxide and/or silicon nitride. The chemistry includes gases, such as, for example, $CH_4$, $NF_3$, hydrogen ($H_2$), He and Ar, which are used to "dig out" active silicon material. The chemistry may be at a high pressure, such as 200-400 mT. The high pressure allows for selective etching of the active silicon region and not the dielectric layers (e.g., the oxide and silicon nitride layers). At higher pressure, the active silicon region is etched at a higher rate than the dielectric layers. At a low pressure the active silicon region is etched at a similar rate as the dielectric layers.

Use of $CH_4$ enables forming of a thicker polymer (or protective) layer over dielectric layers, such as oxide and silicon nitride layers, which reduces etch of the dielectric layers. Although $CH_4$ is stated above, as an alternative other $CH_4$ like gases may be used, such as gases including unsaturated hydrocarbon and/or saturated hydrocarbon molecules (e.g., $C_2H_4$). $H_2$ may aid in promoting etch of active silicon by forming a silane ($SiH_4$) byproduct while suppressing silicon oxide (SiOx) and SiN etch rates. Use of $H_2$ ensures high selectivity to minimize etching of oxide and silicon nitride. The $CH_4$ like gases (or gases including unsaturated hydrocarbon and/or saturated hydrocarbon molecules) suppress a silicon nitride etch rate by forming a graphite (CHx) layer on top of silicon nitride while increasing slightly the oxide etch rate. The oxygen in SiOx can react with CHx to form active surface species for fluorine to etch. $NF_3$ is provided to etch active silicon while keeping SiOx and silicon nitride etch rates low. $NF_3$ is an etchant used to etch active silicon by forming silicon tetrafluoride.

During the over-etch operation, the top electrode may be at 300-1000 W. The bias voltage may be 0-100V. The top and bottom electrodes may provide continuous or pulsed wave signals for synchronous or asynchronous operating modes. The signals may each transition (i) between a first non-zero state and zero, or (ii) between the first non-zero state or a second non-zero state.

In one embodiment, operations 502, 504, 506, 508, 510, 512, 514 are part of a first sub-process of the electrical coupling process and operations 515, 516 and 518 are part of second and third sub-processes of the electrical coupling process. The first sub-process may end subsequent to performing operation 514 and the following operations 515, 516 and 518 are performed as separate processes. The separate processes may be implemented using different substrate processing systems. As an example, operation 515 may be performed using a wet cleaning system, such as that shown in FIG. 9. As an example, operations 516 and 518 may be performed using a plasma enhanced chemical vapor deposition (PECVD) system, such as that shown in FIG. 10. Boxes for operations 515, 516 and 518 of FIG. 5 are dashed to indicate that the operations are performed in different substrate processing systems and/or chambers than the previously performed operations. Subsequent operation 514, the substrate is transferred to a wet cleaning system, such as that shown in FIG. 9.

At 515, a controller (e.g., system controller 912 of FIG. 9) may perform a clean operation to clean the trench 705' and corresponding exposed active silicon region. This may include cleaning other exposed surfaces. The clean operation may be a wet clean operation performed to clean surfaces prior to performing the fill operation at 516. The clean operation may include removing remnant polymer formed during one or more previous etch operations.

Figure 6:
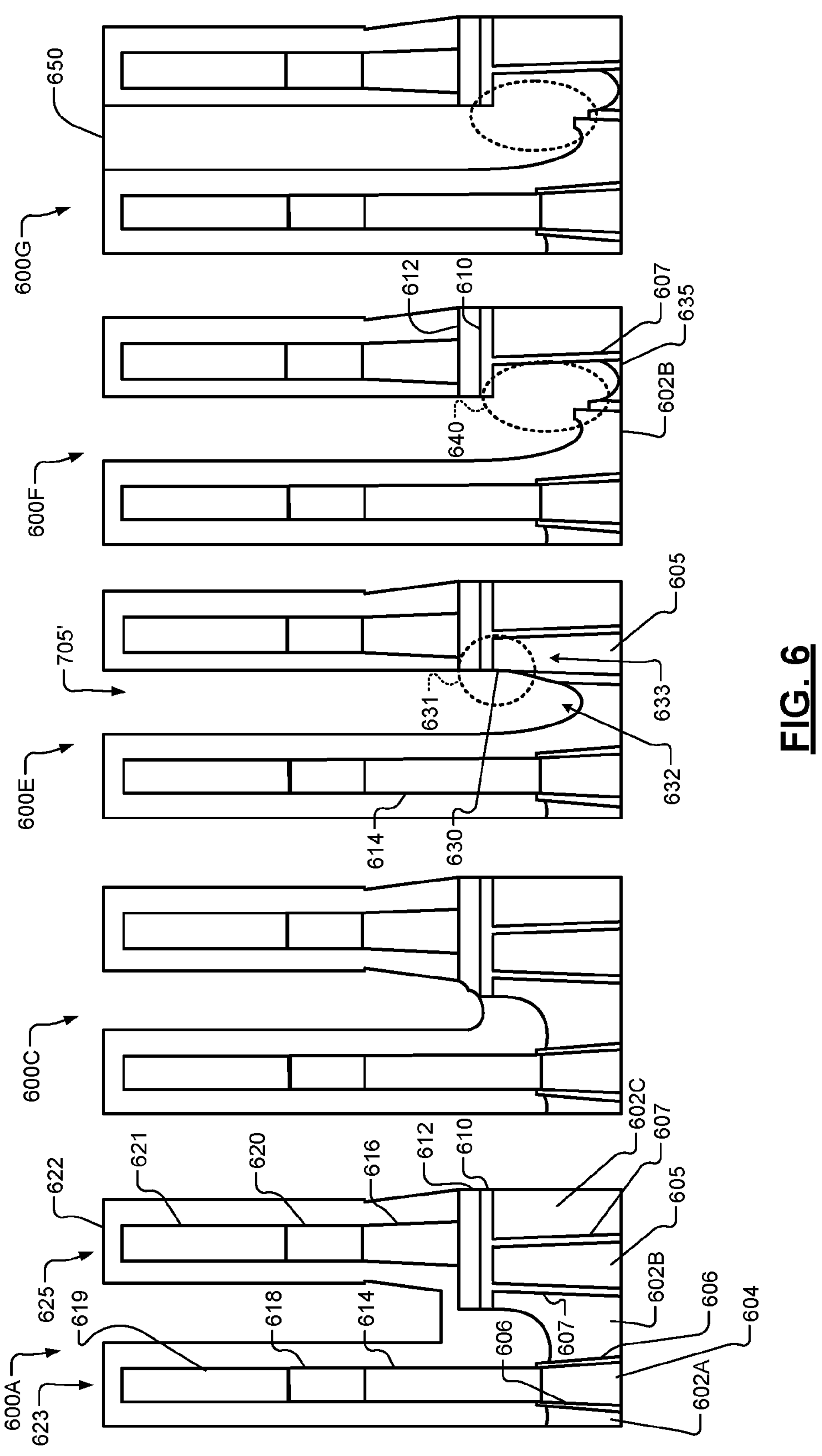
FIG. 6 is an example process diagram showing a cross-sectional view of a memory structure at stages of the electrical coupling method of FIG. 5.

Subsequent to operation 515, the substrate may be transferred to a PECVD system (e.g., substrate processing system 1000 of FIG. 10) or other suitable deposition system. At 516, a system controller (e.g., system controller 1060 of FIG. 10) deposits an electrically conductive filler material 650 to fill the etched away area and the area between the bitline structures to provide an electrical coupling (or electrically conductive element) between the lower portion of the active silicon region and the capacitor to be formed in subsequent operations. The electrically conductive filler material 650 may include polysilicon, $CoSi_x$, and/or other metal-doped silicon. The resultant memory structure 600G is shown in FIG. 6 and as part of a coupling layer 808 of the memory structure 600G of FIG. 8.

At 518, the system controller 1060 forms additional layers on the memory structure 600G including capacitor layers, which include a capacitor electrically coupled to the electrically conductive filler material 650. Operation 518 may be referred to as an electrical contact operation. In the example shown, layers 810, 812, 814, 816, 818 are shown. Although not shown, these layers may be formed during separate operations. As an example, layers 812 and 816 may be conductive layers and include conductors of a capacitor. Layer 814 may be a dielectric layer and include a dielectric material of the capacitor disposed between the conductors. The method may end at 520.

The above-described operations are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

Figure 9:
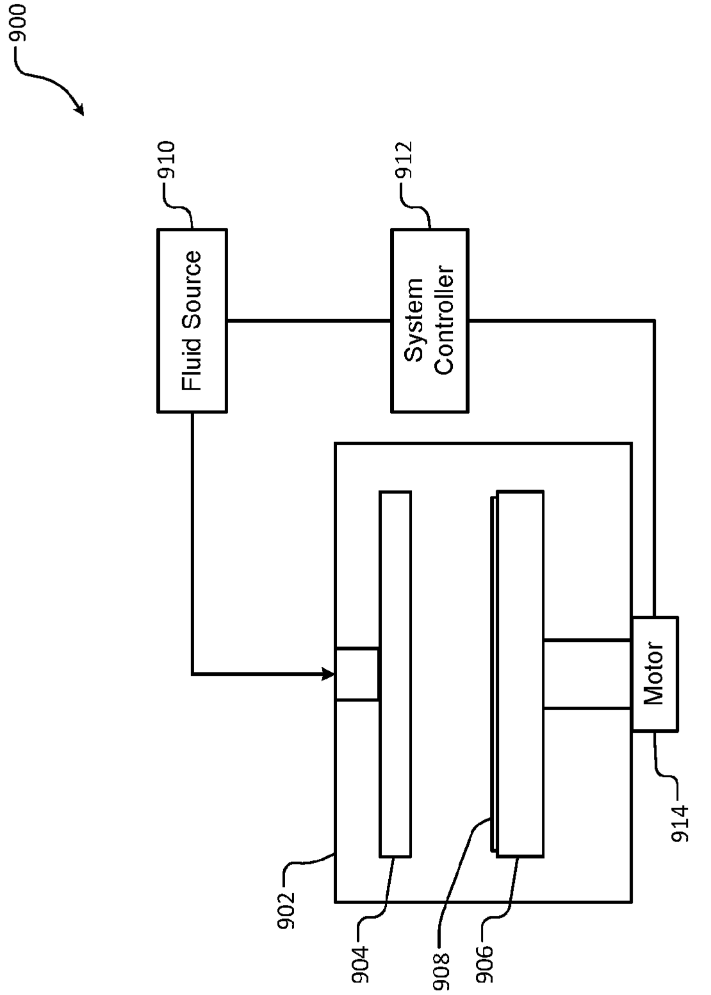
FIG. 9 is a functional block diagram of a wet cleaning system for implementing a portion of an electrical coupling process in accordance with an embodiment of the present disclosure.
Figure 9:

FIG. 9 shows a wet cleaning system 900 that includes a processing chamber 902 having a showerhead 904 and a substrate support 906, which supports a substrate 908. The wet cleaning system 900 may introduce liquid chemicals via a showerhead 910. A system controller 912 may control operation of the wet cleaning system 900 including introduction of the liquid chemicals. The system controller 912 may rotate (or spin) at least a portion of the substrate support 906 to spin the substrate 908 during cleaning via motor 914.

Figure 10:
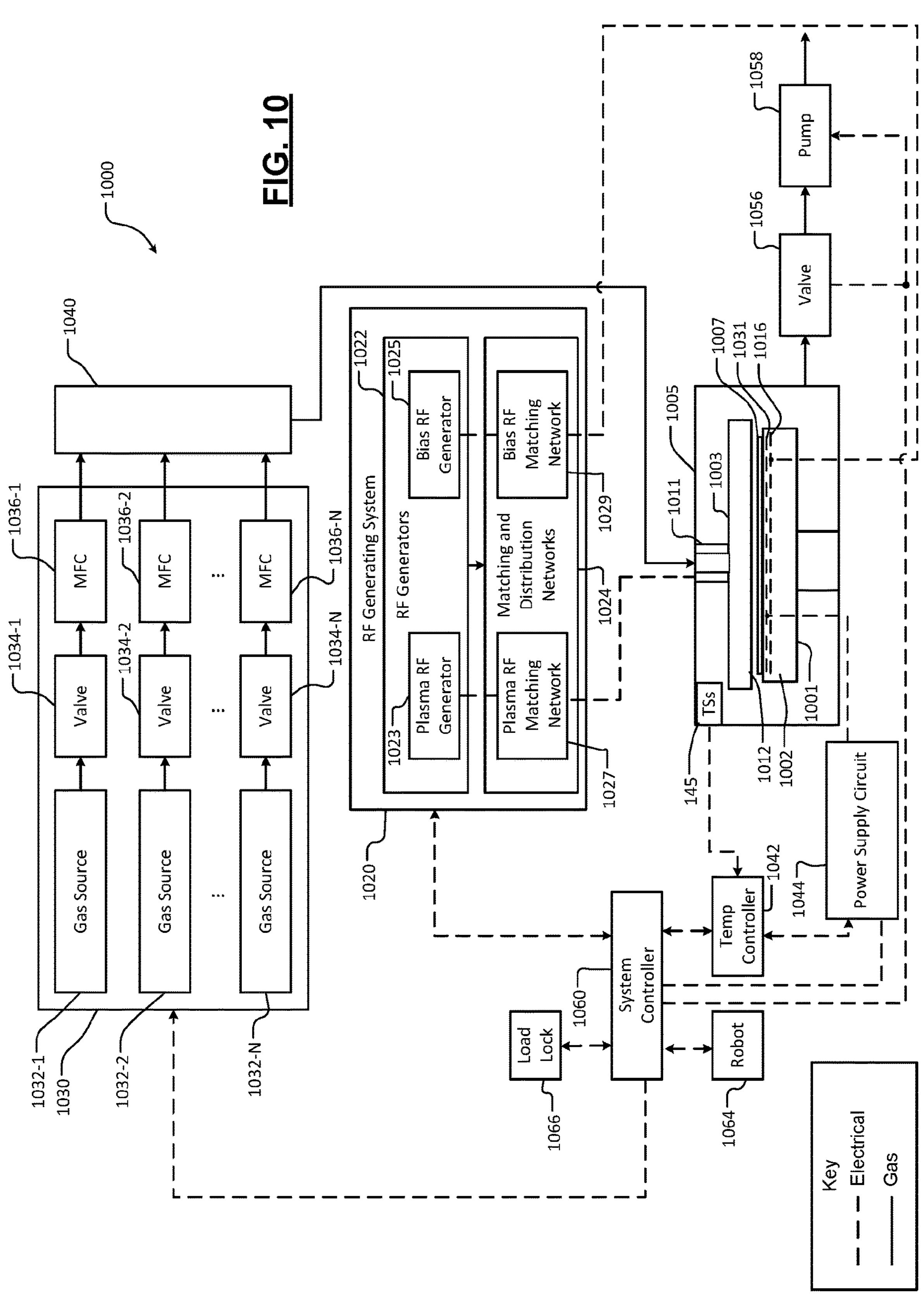
FIG. 10 is a functional block diagram of another substrate processing system for implementing a portion of an electrical coupling process in accordance with an embodiment of the present disclosure.

FIG. 10 shows a substrate processing system 1000 that may include an ESC 1001 or other substrate support and a showerhead 1003. Although FIG. 10 shows a capacitive coupled plasma (CCP) system, the below described example may be applicable to other systems and plasma sources. The substrate processing system 1000 may be implemented as a PECVD system or a chemical vapor deposition (CVD) system.

The substrate processing system 1000 includes a processing chamber 1005. The ESC 1001 and the showerhead 1003 are enclosed within the processing chamber 1005. The processing chamber 1005 may contain RF plasma. During operation, a substrate 1007 is arranged on and electrostatically clamped to the ESC 1001. The showerhead 1003 introduces and distributes gases. The showerhead 1003 may include a stem portion 1011 including one end connected to a top surface of the processing chamber 1005. The showerhead 1003 is generally cylindrical and extends radially outward from an opposite end of the stem portion 1011 at a location that is spaced from the top surface of the processing chamber 1005. A substrate-facing surface of the showerhead 1003 includes holes through which process or purge gas flows.

An RF generating system 1020 generates and outputs RF voltages to one or more upper electrodes 1012 in the showerhead and/or one or more lower electrodes 1016 in the ESC 1001. The upper electrodes 1012 or the lower electrodes 1016 may be DC grounded, AC grounded or at a floating potential. For example only, the RF generating system 1020 may include one or more RF generators 1022 (e.g., a capacitive coupled plasma RF power generator, a bias RF power generator, and/or other RF power generator) that generate RF voltages, which are fed by one or more matching and distribution networks 1024 to the upper electrodes 1012 and/or the lower electrodes 1016. As an example, a plasma RF generator 1023, a bias RF generator 1025, a plasma RF matching network 1027 and a bias RF matching network 1029 are shown. The plasma RF generator 1023 may be a high-power RF generator producing, for example 100 watts (W) to 10 kilo-watts (kW) of power. The bias RF matching network 1029 supplies power to RF electrodes, such as RF electrodes 1016.

A gas delivery system 1030 includes one or more gas sources 1032-1, 1032-2, . . . , and 1032-N (collectively gas sources 1032), where N is an integer greater than zero. The gas sources 1032 supply one or more precursors and gas mixtures thereof. The gas sources 1032 may also supply deposition gas, carrier gas and/or purge gas. Vaporized precursor may also be used. The gas sources 1032 are connected by valves 1034-1, 1034-2, . . . , and 1034-N (collectively valves 1034) and mass flow controllers 1036-1, 1036-2, . . . , and 1036-N (collectively mass flow controllers 1036) to a manifold 1040. An output of the manifold 1040 is fed to the processing chamber 1005. For example only, the output of the manifold 1040 is fed to the showerhead 1003.

The substrate processing system 1000 may include a temperature controller 1042. The temperature controller 1042 controls a power supply circuit 1044. Although shown separately from a system controller 1060, the temperature controller 1042 may be implemented as part of the system controller 1060. The power supply circuit 1044 may supply power, including a high voltage, to electrodes 1031 to electrostatically clamp the substrate 1007 to the ESC 1001. The power supply circuit 1044 may be controlled by the temperature controller 1042 and/or the system controller 1060.

The temperature controller 1042 may control the power supply circuit 1044 based on parameters from other sensors, such as temperature sensors 1045 within the processing chamber 1005. The temperature sensors 1045 may include resistive temperature devices, thermocouples, digital temperature sensors, and/or other suitable temperature sensors.

A valve 1056 and the pump 1058 may be used to evacuate reactants from the processing chamber 1005. The system controller 1060 may control components of the substrate processing system 1000 including controlling supplied RF power levels, pressures and flow rates of supplied gases, RF matching, etc. The system controller 1060 controls states of the valve 1056 and the pump 1058. A robot 1064 may be used to deliver substrates onto, and remove substrates from, the ESC 1001. For example, the robot 1064 may transfer substrates between the ESC 1001 and a load lock 1066. The robot 1064 may be controlled by the system controller 1060. The system controller 1060 may control operation of the load lock 1066.

The valves, gas pumps, power sources, RF generators, etc. referred to herein may be referred to as actuators. The RF generator 1023 may be referred to herein as temperature adjusting element.

In one embodiment, the system controller 1060 may control performance of the operations 516, 518 of the electrical coupling process of FIG. 5. The substrate may be transferred from the processing chamber 902 to the processing chamber 1005 to perform operations 516, 518.

The examples described herein provide electrical coupling processes to provide conductive paths from active silicon regions to capacitors with minimal resistance. Resistance is proportional to 1/area, where area is a cross-sectional area of a conductor taken perpendicular to direction of current flow through the conductor. Since the interface areas between electrically conductive material and active silicon area material is increased, the resistances in these locations are reduced.

Shallow etch into silicon enables more spacer (dielectric) protection at and/or near the top of bitline structures to prevent a bitline short to a capacitor and/or active silicon region. The high-pressure plasma over-etch process operation and subsequent filling provides a wider electrically conductive window. The window may have a square-shaped profile and includes an area of the active silicon region that is etched away. This process solution enables shallow etching while maintaining integrity of a protective layer disposed over bitline structures. The disclosed etching of the active silicon region occurs while minimizing etching of other layers, which improves memory device yield and reduces corresponding costs of fabrication.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Although the terms first, second, third, etc. may be used herein to describe various operations, elements, components, regions, areas, layers, structures, and/or sections, these steps, elements, components, regions, areas, layers, structures, and/or sections should not be limited by these terms, unless otherwise indicated. These terms may be only used to distinguish one step, element, component, region, area, layer, structure, or section from another step, element, component, region, area, layer, structure, or section. Terms such as "first," "second," and other numerical terms when used herein do not imply a sequence or order unless clearly indicated by the context. Thus, a first step, element, component, region, area, layer, structure, or section discussed herein could be termed a second step, element, component, region, areas, layer, structure, or section without departing from the teachings of the example embodiments.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrases "at least one of A, B, and C" and "at least one of A, B, or C" should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method to electrically couple a capacitor to an active silicon region of a memory structure, the method comprising:

providing a substrate including the memory structure;

performing a plurality of deposition and etch cycles to remove a portion of one or more dielectric layers from the substrate, enlarge a trench between adjacent bitline structures of the memory structure, and provide access to at least one of a polymer layer or a dielectric layer adjacent to an upper portion of the active silicon region;

performing a breakthrough operation including etching the at least one of the polymer layer or the dielectric layer in the trench to expose the upper portion of the active silicon region; and performing an over-etch operation to remove the upper portion of the active silicon region to provide access for electrically coupling the capacitor to a remaining lower portion of the active silicon region, wherein the over-etch operation is distinct from the breakthrough operation and includes at least one of i) supplying a different gas than supplied during the breakthrough operation, and ii) supplying gas at a different pressure than supplied during the breakthrough operation.

2. The method of claim 1, wherein:

the memory structure comprises a first dielectric layer comprising the active silicon region, the bitline structures, and the trench adjacent the active silicon region;

the lower portion of the active silicon region includes active silicon;

a second dielectric layer is disposed on the upper portion; and one of the bitline structures is disposed on the second dielectric layer.

3. The method of claim 2, further comprising filling the trench and an open area remaining after removal of the upper portion of the active silicon region with an electrically conductive material for electrically coupling the capacitor to the active silicon in the active silicon region.

4. The method of claim 1, wherein the one or more dielectric layers comprise an oxide layer and a silicon nitride layer.

5. The method of claim 1, wherein the deposition cycles of the plurality of deposition and etch cycles include supply of methane and argon.

6. The method of claim 1, wherein deposition cycles of the plurality of deposition and etch cycles include supplying methane and argon.

7. The method of claim 6, wherein the deposition cycles include supplying the methane and argon at a pressure greater than or equal to 5 mT and less than or equal to 40 mT.

8. The method of claim 6, further comprising refraining from applying a bias voltage to an electrode of a processing chamber during the deposition cycles, wherein the substrate is processed in the processing chamber.

9. The method of claim 1, wherein the etch cycles of the plurality of deposition and etch cycles include supplying a plurality of gases including (i) at least one of nitrogen fluoride, dichlorine, hexafluorobutadiene, fluoromethane, difluoromethane, or carbon tetrafluoride, and (ii) helium.

10. The method of claim 9, wherein the etch cycles include supplying the plurality of gases at a pressure greater than or equal to 5 mT and less than or equal to 30 mT.

11. The method of claim 1, wherein etch cycles of the plurality of deposition and etch cycles include at least one of applying continuous wave or pulsing radio frequency signals to one or more electrodes.

12. The method of claim 1, wherein the breakthrough operation includes supplying carbon tetrafluoride and at least one of argon or helium.

13. The method of claim 12, wherein the breakthrough operation includes supplying the carbon tetrafluoride and at least one of the argon or helium at a pressure greater than or equal to 5 mT and less than or equal to 30 mT.

14. The method of claim 1, wherein the breakthrough operation includes at least one of applying continuous wave or pulsing radio frequency signals to one or more electrodes.

15. The method of claim 1, wherein the over-etch operation includes supplying a plurality of gases at a pressure greater than or equal to 200 mT and less than or equal to 400 mT.

16. The method of claim 14, wherein the over-etch operation includes supplying at least one of nitrogen trifluoride, hydrogen or methane.

17. The method of claim 15, wherein the over-etch operation includes supplying at least one of argon or helium.

18. The method of claim 14, wherein the over-etch operation includes supplying nitrogen trifluoride, hydrogen and methane.

19. The method of claim 1, wherein the over-etch operation includes at least one of applying continuous wave or pulsing radio frequency signals to one or more electrodes.

20. The method of claim 1, further comprising:

cleaning the trench and the upper portion of the active silicon region; and filling the trench and the upper portion of the active silicon region with an electrically conductive material to provide a conductive element electrically coupling the capacitor to the remaining lower portion of the active silicon region.

21. The method of claim 20, further comprising forming a plurality of layers on the bitline structures and the conductive element, wherein the plurality of layers comprise the capacitor.

22. The method of claim 1, wherein the over-etch operation includes supplying a different gas at a different pressure than supplied during the breakthrough operation.

23. The method of claim 1, wherein the over-etch operation is performed while not removing exposed portions of inter dielectric layers in the trench and on the adjacent bitline structures.

24. The method of claim 1, wherein the breakthrough operation is performed subsequent to performing the plurality of deposition and etch cycles.

25. The method of claim 1, wherein the at least one polymer layer or dielectric layer extends upward along the active silicon region towards one of the bitline structures.

26. The method of claim 1, wherein the active silicon region is below one of the bitline structures and separate from the trench by the at least one polymer layer or dielectric layer.

27. The method of claim 1, wherein an oxide layer is disposed below the trench and between a plurality of active silicon regions, which are respectively disposed below the adjacent bitline structures.

28. The method of claim 1, wherein the portion of the one or more dielectric layers includes a plurality of layers that are underneath the trench.

29. The method of claim 1, wherein the active silicon region is fully underneath one of the bitline structures.

30. The method of claim 1, wherein:

the one or more dielectric layers include a plurality of dielectric layers disposed between one of the bitline structures and the active silicon region; and the portion of the one or more dielectric layers is a portion of each of the plurality of dielectric layers.

31. A method to electrically couple a capacitor to an active silicon region of a memory structure, the method comprising:

providing a substrate including the memory structure with a plurality of bitline structures, wherein the plurality of bitline structures define a trench;

performing a plurality of deposition and etch cycles to remove a portion of each of a plurality of dielectric layers from the substrate and provide access to at least one of a polymer layer or a dielectric layer adjacent to an upper portion of the active silicon region, wherein the portion of each of the plurality of dielectric layers is below the trench, wherein the at least one of the polymer layer or the dielectric layer is below the plurality of dielectric layers;

performing a breakthrough operation including etching the at least one of the polymer layer or the dielectric layer in the trench to expose the upper portion of the active silicon region; and performing an over-etch operation to remove the upper portion of the active silicon region to provide access for electrically coupling the capacitor to a remaining lower portion of the active silicon region.

* * * * *